(12) United States Patent
Yoshino et al.

(10) Patent No.: US 7,110,017 B2
(45) Date of Patent: Sep. 19, 2006

(54) SIGNAL CONTROLLING CIRCUIT

(75) Inventors: Takeshi Yoshino, Hachioji (JP); Kenji Izumiya, Hachioji (JP); Kouichi Takaki, Hachioji (JP)

(73) Assignee: Konica Corporation, Tokyo (JP)

( * ) Notice: Subject to any disclaimer, the term of this patent is extended or adjusted under 35 U.S.C. 154(b) by 588 days.

(21) Appl. No.: 10/383,048

(22) Filed: Mar. 6, 2003

(65) Prior Publication Data

US 2003/0177410 A1 Sep. 18, 2003

(30) Foreign Application Priority Data

Mar. 15, 2002 (JP) ............................. 2002-072081

(51) Int. Cl.
*B41J 2/435* (2006.01)

(52) U.S. Cl. ..................................... 347/249

(58) Field of Classification Search ........ 347/234–237, 347/247–250; 358/474

See application file for complete search history.

(56) References Cited

U.S. PATENT DOCUMENTS 4,926,263 A * 5/1990 Yokota ....................... 358/474
5,331,342 A * 7/1994 Shimatani et al. .......... 347/249
5,760,816 A * 6/1998 Morrison .................... 347/247
6,154,292 A * 11/2000 Motoi ........................ 358/474

* cited by examiner

*Primary Examiner*—Hai Pham
(74) *Attorney, Agent, or Firm*—Frishauf, Holtz, Goodman & Chick, P.C.

(57) ABSTRACT

There is described a signal controlling circuit particularly used in a printer or copier. The circuit includes a delay chain section to generate a plurality of delayed clock signals, a synchronized signal detecting section to detect a number of delay stages, a total delay time of which is equivalent to a single period of the reference clock signal, based on delayed clock signals synchronized with an index signal and are selected from the plurality of delayed clock signals, an index signal counting section to count index signals inputted into the index signal counting section, a phase shift calculating section to calculate a phase shift amount in respect to the reference clock signal, and a delayed clock selecting section to select a specific delayed clock signal out of the plurality of delayed clock signals in an alternative way, so as to output the specific delayed clock signal to an external section.

10 Claims, 9 Drawing Sheets

SIGNAL CONTROLLING CIRCUIT

BACKGROUND OF THE INVENTION

The present invention relates to a signal controlling circuit, and particularly, to a signal controlling circuit used in a printer or copier.

There is a case where, in an image forming apparatus such as a copier, when image is read or written, an read image or formed image is inclined (distorted) by a change of lens characteristic of a writing unit and reading unit due to the temperature change, production error at the time of the assembly of an apparatus, or production fluctuation of each product. Accordingly, when the image is formed, the image data is processed in a pixel unit and the processing to correct the image so that it is vertically formed, is conducted.

However, such a processing of the image data influences the image processing such as the error scattering, and there is a case where the moire is generated, and it is a cause of the image quality deterioration of the image. On the one hand, in the image forming apparatus such as a copier, one image is outputted for each line in the main scanning direction, and by repeating it in the sub scanning direction, the image is formed.

SUMMARY OF THE INVENTION

To overcome the abovementioned drawbacks in conventional image-forming apparatus, it is an object of the present invention to provide a circuit for accurately correcting the image, by controlling the writing-start position of the head of each line of the image by the resolving power not larger than the period of the reference clock.

Accordingly, to overcome the cited shortcomings, the abovementioned object of the present invention can be attained by signal controlling circuits and image-forming apparatus described as follow.

(1) A circuit for controlling signals to form an image, the circuit comprising: a delay chain section, including a plurality of delay stages cascaded for delaying a reference clock signal step by step, to generate a plurality of delayed clock signals, each of which is outputted from each of the plurality of delay stages; a synchronized signal detecting section to detect a number of delay stages, a total delay time of which is equivalent to a single period of the reference clock signal, based on delayed clock signals, which are synchronized with an index signal and are selected from the plurality of delayed clock signals, the index signal serving as a leading edge reference signal of each scanning line of the image and being inputted into the synchronized-signal detecting section from an external section; an index signal counting section to count index signals inputted into the index signal counting section, so as to output a count number of the index signals; a phase shift calculating section to calculate a phase shift amount in respect to the reference clock signal, based on the number of delay stages detected by the synchronized-signal detecting section, the count number counted by the index signal counting section and a phase shift controlling signal inputted into the phase shift calculating section from an external section; and a delayed clock selecting section to select a specific delayed clock signal out of the plurality of delayed clock signals in an alternative way, based on the phase shift amount calculated by the phase shift calculating section, so as to output the specific delayed clock signal to an external section.

(2) The circuit of item 1, further comprising: a signal generating section to generate a leading edge positioning signal, which is synchronized with the specific delayed clock signal outputted by the delayed clock selecting section, based on a signal generating command signal inputted into the signal generating section from an external section.

(3) The circuit of item 2, wherein the phase shift calculating section outputs a carry signal when the phase shift amount exceeds the single period of the reference clock signal, and wherein the signal generating section generates the leading edge positioning signal, based on the carry signal and the signal generating command signal.

(4) An apparatus for forming an image, the apparatus comprising: an image-processing section to process image data, which represents the image; an image-writing element driving section to drive an image-writing element, based on processed image data, outputted from the image-processing section; an index sensor to detect an index signal serving as a leading edge reference signal for each scanning line of the image; a reference clock generator to generate a reference clock signal; a signal controlling circuit to control the index signal and the reference clock signal, so as to output a pixel clock signal, which is inputted into the image-writing element driving section; and a control section to control at least the image-processing section, the image-writing element driving section and the signal controlling circuit; wherein the signal controlling circuit comprises: a delay chain section, including a plurality of delay stages cascaded for delaying the reference clock signal step by step, to generate a plurality of delayed clock signals, each of which is outputted from each of the plurality of delay stages; a synchronized signal detecting section to detect a number of delay stages, a total delay time of which is equivalent to a single period of the reference clock signal, based on delayed clock signals, which are synchronized with the index signal and are selected from the plurality of delayed clock signals, the index signal being inputted into the synchronized-signal detecting section from the index sensor; an index signal counting section to count index signals inputted into the index signal counting section, so as to output a count number of the index signals; a phase shift calculating section to calculate a phase shift amount in respect to the reference clock signal, based on the number of delay stages detected by the synchronized-signal detecting section, the count number counted by the index signal counting section and a phase shift controlling signal inputted into the phase shift calculating section from the control section; and a delayed clock selecting section to select a specific delayed clock signal out of the plurality of delayed clock signals in an alternative way, based on the phase shift amount calculated by the phase shift calculating section, so as to output the specific delayed clock signal as the pixel clock signal to the image-writing element driving section.

(5) The apparatus of item 4, wherein the signal controlling circuit further comprises: a signal generating section to generate a leading edge positioning signal, which is synchronized with the specific delayed clock signal, serving as the pixel clock signal, outputted by the delayed clock selecting section, based on a signal generating command signal inputted into the signal generating section from the control section; and wherein the signal controlling circuit also outputs the leading edge positioning signal to both the image-processing section and the image-writing element driving section.

(6) The apparatus of item 4, wherein the image-writing element is a laser diode, and the image-writing element driving section is a laser-diode driving section.

(7) The apparatus of item 5, wherein the phase shift calculating section outputs a carry signal when the phase shift amount exceeds the single period of the reference clock signal, and wherein the signal generating section generates the leading edge positioning signal, based on the carry signal and the signal generating command signal.

(8) A signal controlling circuit, comprising: a delay chain section, including a plurality of delay stages cascaded for delaying a reference clock signal step by step, to generate a plurality of delayed clock signals, each of which is outputted from each of the plurality of delay stages; a detecting section to detect a number of delay stages, a total delay time of which is equivalent to a single period of the reference clock signal, based on a delayed clock signal, which is synchronized with a predetermined signal inputted into the detecting section from an external section and is selected from the plurality of delayed clock signals; a counting section to count predetermined signals, each of which is the predetermined signal, in order to output a count number of them; a phase shift calculating section to calculate a phase shift amount in respect to the reference clock signal, based on the number of delay stages detected by the detecting section, the count number counted by the counting section and a phase shift controlling signal inputted into the phase shift calculating section from an external section; and a selecting section to select a specific delayed clock signal out of the plurality of delayed clock signals in an alternative way, based on the phase shift amount calculated by the phase shift calculating section, so as to output the specific delayed clock signal to an external section.

(9) The signal controlling circuit of item 8, further comprising: a signal generating section to generate a signal, which is synchronized with the specific delayed clock signal outputted by the delayed clock selecting section, based on a signal generating command signal inputted into the signal generating section from an external section.

(10) The signal controlling circuit of item 9, wherein the phase shift calculating section outputs a carry signal when the phase shift amount exceeds the single period of the reference clock signal, and wherein the signal generating section generates the signal, based on the carry signal and the signal generating command signal.

Further, to overcome the abovementioned problems, other signal controlling circuits, embodied in the present invention, will be described as follow:

(11) A signal controlling circuit, characterized in that the signal controlling circuit is provided with:

a delay means by which, by a plurality of delay elements which are multi-stage-connected, the reference clock signal is delayed and outputted as the delay reference clock signal for each stage; the first input means for external-inputting a predetermined signal; a detection means for detecting the number of stages of the delay element according to a portion of one period of the reference clock signal, according to the delay reference clock signal synchronized with a predetermined signal inputted by the first input means; a counting means for counting a predetermined signal inputted by the first input means; the second input means for external-inputting a phase control signal; a phase calculation means for calculating the phase amount to the reference clock signal according to the number of stages detected by the detection means, the counting amount counted by the counting means, and the phase control signal inputted by the second input means; and a signal selection means by which, according to the phase amount calculated by the phase calculation means, a signal is alternatively selected from the delay reference clock signals, and the selected signal is external-outputted.

According to the above invention, for example, according to the delay reference clock signal synchronized with a predetermined signal such as a pulse signal or step signal, the number of stages of the delay elements according to one period of the reference clock signal is detected, and the phase amount is calculated according to this number of stages, counting amount, and phase control signal. Then, according to this phase amount, the signal which is alternatively selected from the delay reference clock signal is external-outputted. Thereby, the timing of the delay reference clock signal can be controlled in the time period not larger than one period of the reference clock signal, and the high accuracy control can be realized.

Further, by arbitrarily setting a phase control signal, the delay reference clock signal whose phase is so much changed as an arbitrary phase amount to the reference clock signal can be selected and outputted.

(12) The signal controlling circuit according to item 11, characterized in that the signal controlling circuit is further provided with: the third input means by which a signal generation control signal is inputted from the outside; and according to the signal generation control signal inputted by the third input means, a signal generation means by which a signal synchronized with s signal inputted by the signal selection means is generated, and the generated signal is external-outputted.

According to the above invention, a signal synchronized with the signal outputted from the signal selection means is generated at a timing based on the signal generation control signal. For example, when this signal is a signal for setting the writing-start position of the leading edge of each line of the image, the writing-start position of the leading edge of each line of the image can be high accurately controlled.

Further, by arbitrarily setting the signal generation control signal, the writing-start position of the leading edge of each line of the image can be arbitrarily controlled.

(13) The signal controlling circuit according to item 12, characterized in that the phase calculation means outputs the directive signal when the phase amount found by the calculation exceeds the period of the reference clock signal, and the signal generation means generates the signal synchronized with the signal inputted from the signal selection means according to the directive signal inputted from the phase calculation means and to the signal generation control signal.

According to the above invention, the signal generation means generates the signal synchronized with the signal outputted from the signal selection means according to the directive signal and the signal generation control signal. For example, when this signal is a signal for setting the writing-start position of the head of each line of the image, the inclination of the image can be corrected and outputted.

BRIEF DESCRIPTION OF THE DRAWINGS

Other objects and advantages of the present invention will become apparent upon reading the following detailed description and upon reference to the drawings in which.

DETAILED DESCRIPTION OF THE PREFERRED EMBODIMENT

Figure 1:
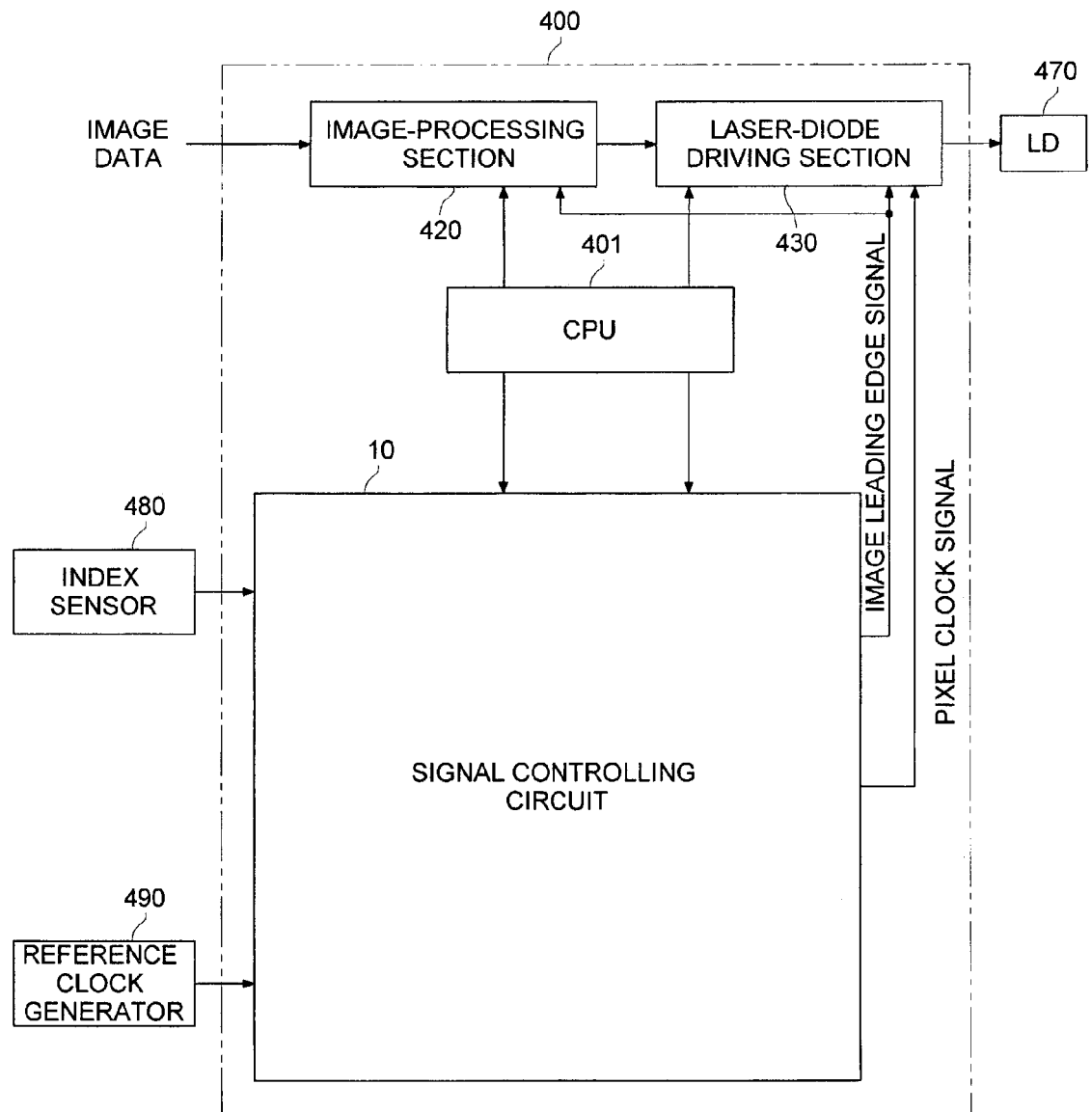
FIG. 1 is a block diagram of a configuration of main electronic sections of an image-forming apparatus embodied in the present invention.

Referring to the drawings, an image-forming apparatus embodied in the present invention will be detailed in the following. Initially, with respect to the image-forming apparatus employing the clock-generating circuit, the whole configuration of the image-forming apparatus will be detailed in the following.

(Whole Mechanical Configuration of the Image-forming Apparatus)

Figure 2:
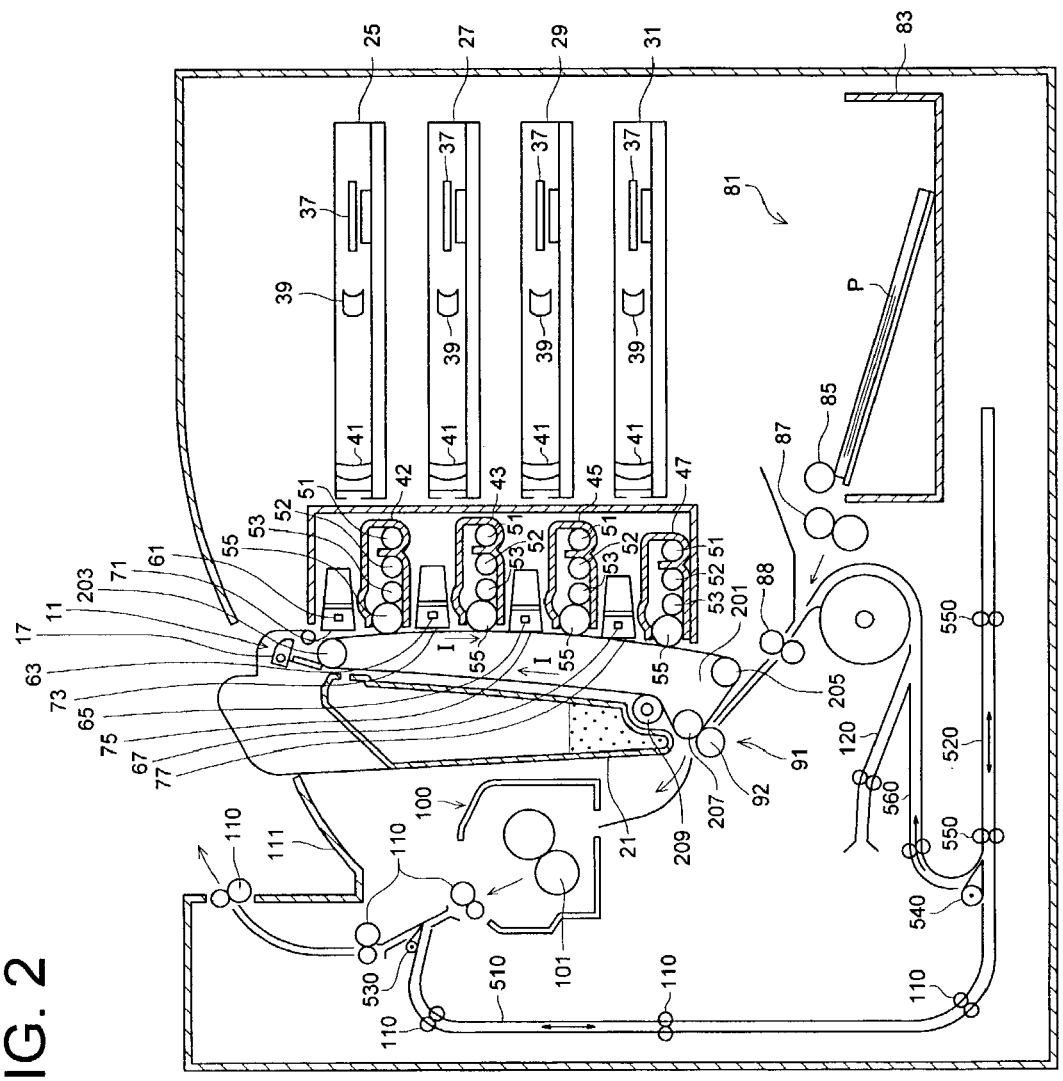
FIG. 2 is a mechanical configuration of a color image-forming apparatus, for which the signal controlling circuit and the image-forming apparatus embodied in the present invention can be applied.

FIG. 2 shows a mechanical configuration of a color image-forming apparatus, for which the clock-generating circuit and the image-forming apparatus, embodied in the present invention, can be applied. Referring to FIG. 2, the whole configuration of the color image-forming apparatus will be detailed in the following.

Incidentally, the above embodiment is a multi-color image forming apparatus, and it is taken for instance herein the color image forming apparatus using toners of four colors, namely, Y (yellow), M (magenta), C (cyan), and K (black), and employing an image-bearing member shaped in a belt, instead of one shaped in a drum.

Image-bearing member 201 (photoreceptor 201), which is shaped in an endless belt and entrained around the upper roller 203, the lower roller 205, and the side roller 207, is extended in the upward and downward direction by the upper roller 203 and the lower roller 205, and is driven in the direction of the arrow marks I. Further, pressing roller 209, serving as guiding means for guiding image-bearing member 201 to the direction of a closed space formed by image-bearing member 201 by pressing it toward the closed space, is mounted on the surface portion of image-bearing member 201 moving from down to up.

Further, cleaning means 11, which contacts and rubs image-bearing member 201 to remove developing agents attached on the surface of image-bearing member 201, is disposed at the upper surface portion of image-bearing member 201, which moves from down to up. Further, recovery box 21, serving as collecting means for collecting the developing agents removed by cleaning means 11, is disposed below cleaning means 11 along image-bearing member 201.

Still further, latent image forming means for forming a latent image on image-bearing member 201 will be detailed in the following. Since the image-forming apparatus, embodied in the present invention, is a four-color image forming apparatus, it comprises four latent image forming means, each of which corresponds to each of the four colors. Concretely speaking, there are provided optical writing section 25 for color Y, which emits a laser beam onto the image-bearing member 201 to form a latent image of color Y (yellow), optical writing section 27 for color M, which emits a laser beam onto image-bearing member 201 to form a latent image of color M (magenta), optical writing section 29 for color C, which emits a laser beam onto image-bearing member 201 to form a latent image of color C (cyan) and optical writing section 31 for color K, which emits a laser beam onto image-bearing member 201 to form a latent image of color K (black).

Still further, developing units will be detailed in the following. Four developing units for developing the latent images for the respective colors, which have been formed on the image-bearing member 201, are provided. Concretely speaking, there are provided developing unit 42 for color Y, which develops the latent image formed by optical writing section 25 for color Y, developing unit 43 for color M, which develops the latent image formed by optical writing section 27 for color M, developing unit 45 for color C, which develops the latent image formed by optical writing section 29 for color C and developing unit 47 for color K for developing the latent image formed by optical writing section 31 for color K.

Still further, charging electrodes of charging means for giving electronic charges onto image-bearing member 201 are disposed opposite image-bearing member 201, corresponding to each of developing units 42, 43, 45, and 47 for the four colors. Concretely speaking, there are provided charging electrode 61 for color Y, charging electrode 63 for color M, charging electrode 65 for color C and charging electrode 67 for color K. In addition, each of grids 71, 73, 75, and 77 is disposed at each of the charging means corresponding to each of the four colors, to control the potential of the electronic charge charged on image-bearing member 201.

Numeral 81 indicates a paper feeding section, in which cassette 83 for storing transfer paper P, serving as a transfer material, is equipped. Conveying-out roller 85 takes out transfer paper P one by one from cassette 83, and transport roller pair 87 and registration roller pair 88 further convey transfer paper P while sandwiching it between paired rollers, so as to feed transfer paper P to transfer means 91. Transfer roller 92, electronic potential of which is kept at a polarity opposite to that of image-bearing member 201, is disposed at transfer means 91, so as to cooperate with side roller 207 in sandwiching image-bearing member 201 between them.

Numeral 100 indicates a fixing section in which a pair of heat rollers 101 applies heat and pressure onto the transfer paper P while holding it between heat rollers 101 to fix a toner image onto transfer paper P, and numeral 110 indicates a pair of transport rollers, which conveys the transfer paper P, having the fixed toner-image, to receiving tray 111 while holding it between transport rollers 110. Further, numeral 120 indicates a paper transport path, through which transfer paper P having a separate size is fed from another paper feeding section provided outside the apparatus.

Next, the overall operation of the image forming apparatus having the abovementioned configuration will be detailed in the following. When image-bearing member 201 is driven in the direction of the arrow marks I, the charging means for color Y, including charging electrode 61 and grid 71, charges the surface of image-bearing member 201 up to a predetermined charged potential. Then, optical writing means 25 for color Y forms a latent image on image-bearing member 201. Further, Coulomb's force attracts toner borne on the developing agents to image-bearing member 201 so as to form a toner image on image-bearing member 201. The same operation as the above is performed for the rest of colors, namely, M, C, and K, and toner images of Y, M, C, and K are formed on image-bearing member 201.

On the other hand, conveying-out roller 85 takes out transfer paper P from paper feeding section 81 and transport roller pair 87 conveys it to transfer means 91. Then, registration roller 88 adjusts the timing of feeding transfer paper P to transfer means 91, so as to synchronize transfer paper P with the toner image borne on image-bearing member 201. At transfer means 91, transfer roller 92 of transfer means 91 charges transfer paper P to transfer the toner image borne on image-bearing member 201 onto transfer paper P. Further, in fixing section 100, the toner image transferred onto transfer paper P is fused and fixed onto transfer paper P by applying heat and pressure to it, and then, a pair of transport rollers 110 further conveys transfer paper P having the fixed toner image to eject it onto receiving tray 111. On the other hand, after the transferring operation is completed, the residual toner particles remained on image-bearing member 201 are removed by blade 17 of cleaning means 11, and are stored in collection box 21. Incidentally, the image-forming mode mentioned above is a one side image-forming mode in which the image is formed on only an obverse side of the transfer paper P and first gate flip 530, detailed later, is always switched so as to open the paper-feeding path towards the receiving tray 111.

Next, the duplex image-forming mode will be detailed in the following.

Numeral 510 indicates a first return path of the transfer paper P, numeral 530 indicates a first gate flip to switch the paper-feeding path, numeral 540 indicates a second gate flip to switch the paper-feeding path, numeral 520 indicates a second return path of the transfer paper P, numeral 550 indicates a paper-driving roller pair to move the transfer paper P in both forward and reverse directions, numeral 520 indicates a second return path of the transfer paper P, and numeral 560 indicates a third return path of the transfer paper P.

In the duplex image-forming mode, since the first gate flip 530 is switched so as to open the paper-feeding path towards the first return path 510 and the second gate flip 540 is switched so as to open the paper-feeding path towards the second return path 520 when the color image is formed and fixed on the obverse side of the transfer paper P, the transfer paper P, having the color image on its obverse side, is fed into the first return path 510 by the pair of transport roller 110 and further fed into the second return path 520 by forward-driving action of the paper-driving roller pair 550. When a sensor (not shown in the drawings), disposed near the paper-driving roller pair 550, detects the trailing edge of the transfer paper P, the paper-driving roller pair 550 stops its forward-driving action and the second gate flip 540 is switched so as to open the paper-feeding path towards the third return path 560. Then, the paper-driving roller pair 550 starts its reverse-driving action so as to feed the transfer paper P to the registration roller 88. Successively, in the same process as that for forming the color image of the obverse side, another color image is formed and fixed on the reverse side of the transfer paper P, and finally, the transfer paper P having the duplex image is ejected onto the receiving tray 111 by the pair of transport roller 110.

(Detailed Configuration of the Image-forming Apparatus)

The image-forming apparatus embodied in the present invention will be detailed in the following.

FIG. 1 shows a block diagram of the configuration of the electronic circuit section, which is incorporated in each of optical writing sections 25, 27, 29, 31 respectively corresponding to colors Y, M, C, K, with CPU 401 and other blocks.

Incidentally, although only a single electronic circuit section 400 is indicated in FIG. 1, four clock-generating circuits, each of which has the same configuration as that indicated in FIG. 1 and corresponds to each of four colors Y, M, C, K, are provided in the color image-forming apparatus. While, in a monochrome image-forming apparatus, only a single clock-generating circuit is provided.

As shown in FIG. 1, electronic circuit section 400 includes CPU 401, serving as controlling means for conducting various kinds of controlling actions, signal controlling circuit 10 being a section featured by the present invention, image-processing section 420 for performing image-processing operations and laser-diode driving section 430 to generate laser-diode driving signals corresponding to pixel clock signals on the basis of the result of image-processing operations.

The electronic circuit section 400, embodied in the present invention, can be roughly divided into four sections, such as CPU 401 serving as a controlling means, image-processing section 420, laser-diode driving section 430 and signal controlling circuit 10. The configuration and operations of the signal controlling circuit 10 will be detailed in the following.

Referring to FIGS. 3–9, an embodiment of a signal controlling circuit to which the present invention is applied is detailed below. In the present embodiment, it will be described under a assumption that, by using the signal controlling circuit 10, the correction of the inclination (distortion) of the image is conducted on one image data.

Figure 3:
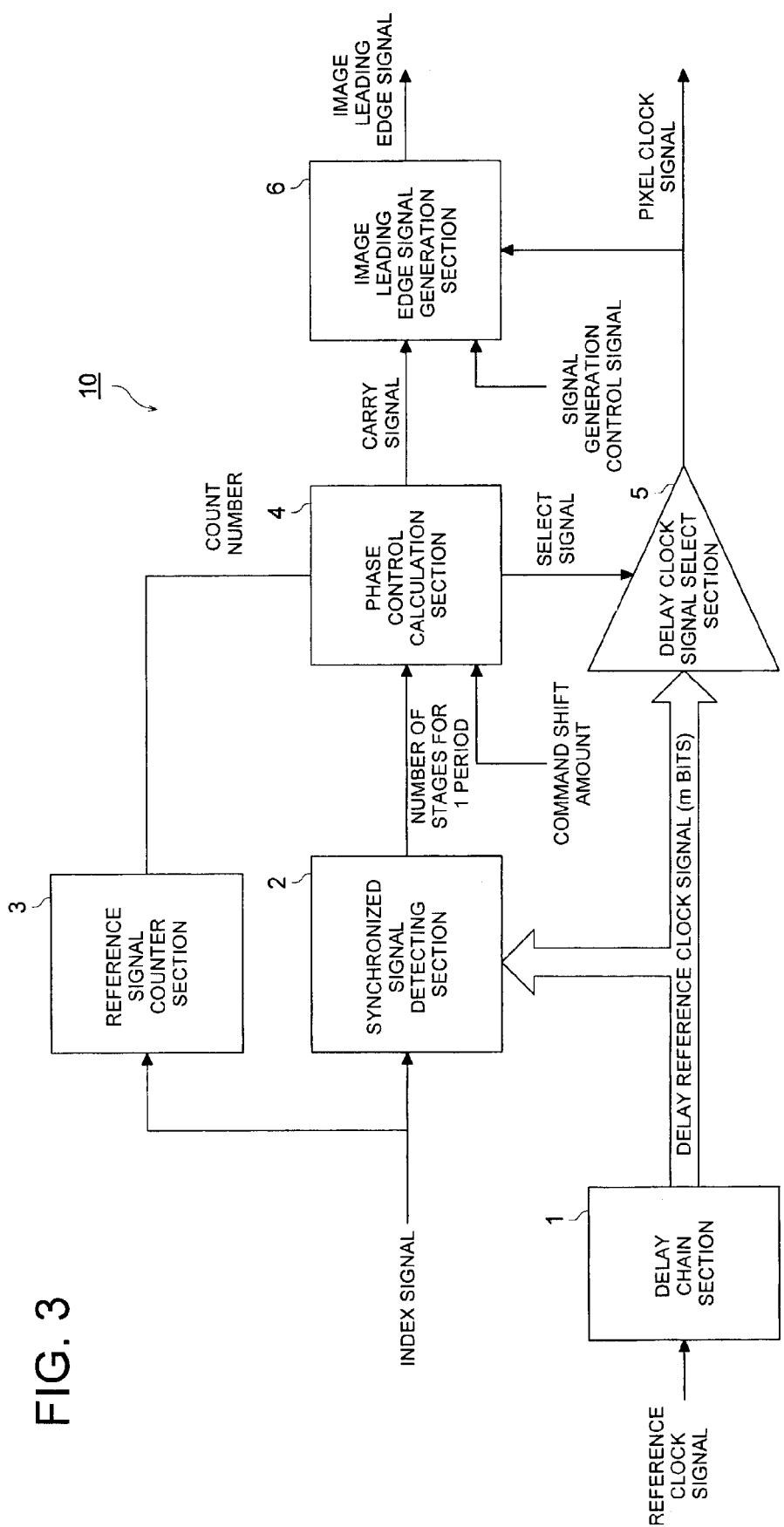
FIG. 3 is a block diagram showing the structure of a signal controlling circuit.

FIG. 3 is a block diagram showing the structure of the signal controlling circuit 10. The signal controlling circuit 10 is structured by a delay chain section 1, synchronized signal detecting section 2, reference signal counter section 3, phase control calculation section 4, delay clock signal selection section 5 and image leading edge signal generation section 6. The signal controlling circuit 10 is used, for example, for the image-forming apparatus shown in FIG. 1 and FIG. 2.

Figure 4:
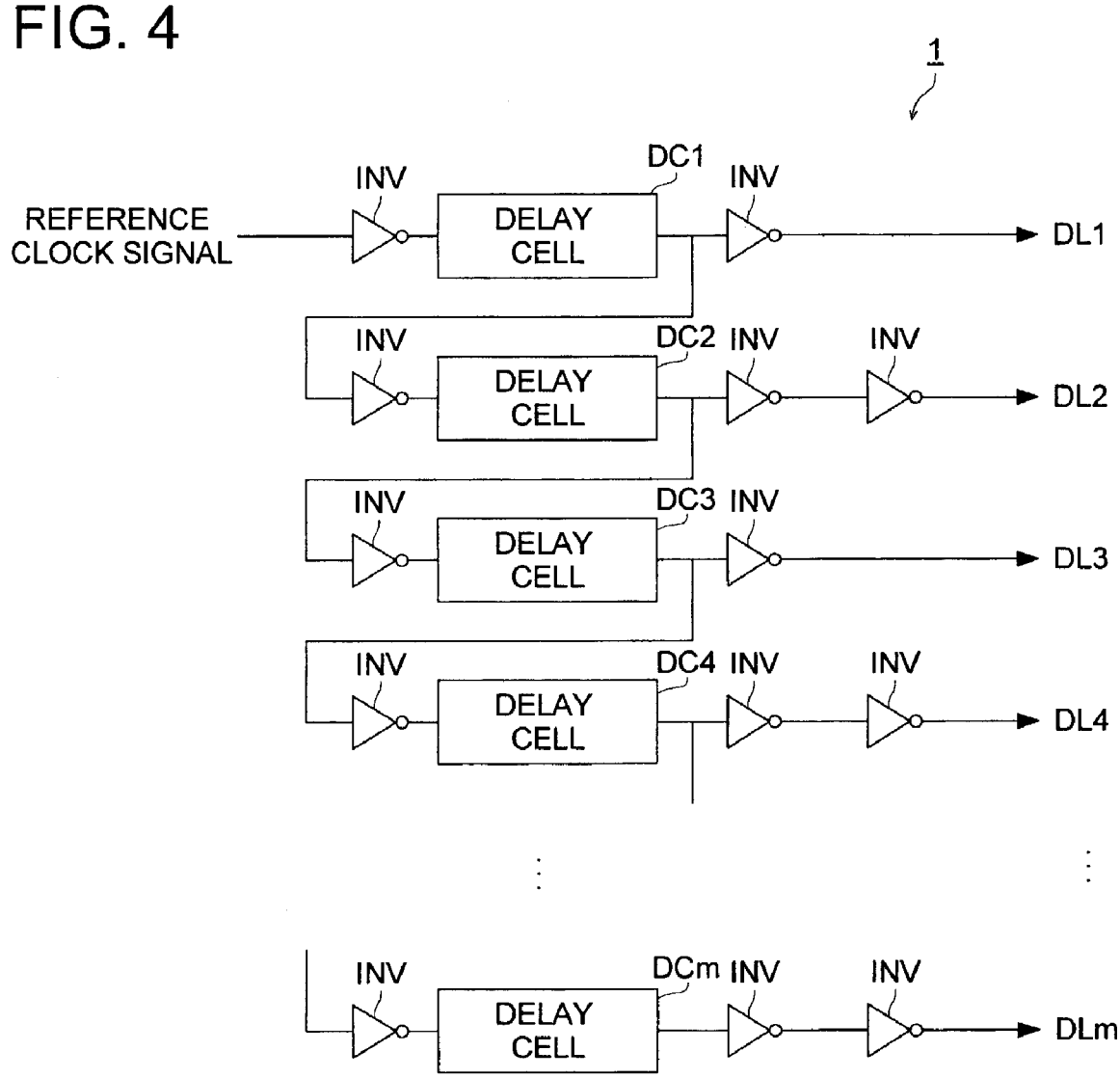
FIG. 4 is a view showing the circuit structure of a delay chain section.

The delay chain section 1 is structured, as shown in FIG. 4, by m delay cells DC 1–m and a plurality of inverters INV, and the reference clock signal, which is outputted from a reference clock generator 490 shown in FIG. 1, is delayed and outputted to the synchronized signal detecting section 2 and the delay clock signal selection section 5. Herein, the inverter INV is inserted for suppressing the collapse of the duty of the reference clock signal.

The delay cells DC 1–m delay the respectively inputted input signals by a predetermined delay amount (for example, td (ps order)) and respectively output them. That is, as shown in FIG. 4, when the delay cells Dc 1–m are connected in multi-stages (series), and the output stage corresponding to each delay cell is provided, the input signal delayed by integer times (1–m times) of a predetermined delay amount is outputted from each output stage. This signal is outputted to the synchronized signal detecting section 2 and delay clock signal selection section 5 as the signal of m-pit width.

In detail, in FIG. 4, the delay cell DC 1 of the first stage delays the reference clock signal by a predetermined delay amount (for example, td (ps order)) and outputs it. Then, the outputted signal is outputted from the output stage corresponding to the delay cell DC 1 to the synchronized signal detecting section 2 and delay clock signal selection section 5 as the delay signal DL 1, and outputted to delay cell DC 2. Further, the delay cell DC 2 of the second stage delays the inputted delay signal DL 1 by a predetermined delay amount (for example, td (ps order)) and outputs it. Then, the outputted signal is outputted from the output stage corresponding to the delay cell DC 2 as the delay signal DL 2 to the synchronized signal detecting section 2 and delay clock signal selection section 5, and outputted to the delay cell DC 3.

In the same manner, m stage delay cell DC m delays the inputted delay signal DL m-1 by a predetermined delay amount (for example, td (ps order)), and it is outputted. Then, the outputted signal is outputted from the output stage corresponding to the delay cell DC m as the delay signal DL m to the synchronized signal detecting section 2 and delay clock signal selection section 5. Herein, the delay chain section 1 has the function as the delay means. Further, the delay signal DL 1–m means the delay reference clock signal.

Figure 5:
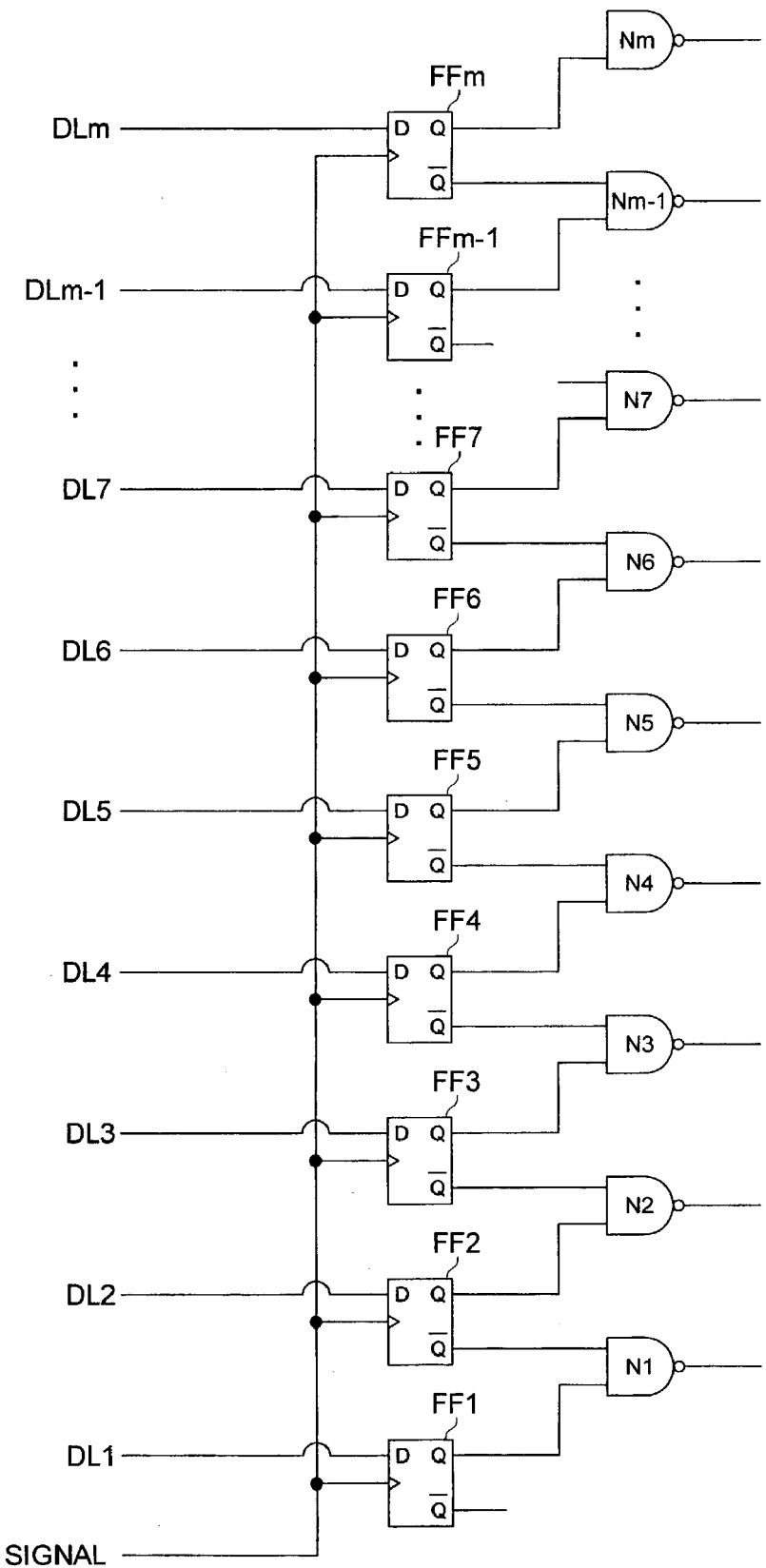
FIG. 5 is a view showing the circuit structure of a detection circuit with which a synchronized signal detecting section is provided.

The synchronized signal detecting section 2 is structured, as shown in FIG. 5, by m D flip-flops FF 1–m, m NAND circuits N1–m, and the calculation circuit (graphic display is omitted). D flip-flops FF 1–m detects the status of the delay signal DL 1–m ("H" or "L") inputted from the delay chain section 1 at the timing at which an index signal is inputted, and outputs to the corresponding NAND circuits N 1–m.

The index signal is detected in an index sensor 480, shown in FIG. 1, at every time when the main-scanning operation of the laser beam is performed in each of the optical writing sections. The index sensor 480 is incorporated in each of optical writing sections 25, 27, 29, 31 respectively corresponding to colors Y, M, C, K, in the image-forming apparatus shown in FIG. 2.

To the D flip-flops FF 1–m, the delay signals DL 1–m outputted from the delay chain section 1 to each input terminal D are inputted, and to each clock terminal, the index signal is inputted. Then, the status ("H" or "L") of the delay signal DL 1–m inputted to each input terminal D by being synchronized with the index signal is maintained, and the maintained value is outputted from the output terminal Q, and the value in which the maintained value is reversed, is outputted from a reversal output terminal.

Then, to the NAND circuits N 1–m, the value to be outputted from the output terminal Q of the D flip-flop of the front stage (herein, 1–m stages), and the value outputted from the reversal output terminal of the D flop-flop of the next stage (herein, 2–m+1 stages) are respectively inputted, and the negative AND of the inputted 2 values is calculated, and the calculation result is outputted to the calculation circuit (graphic display is omitted).

The calculation circuit (graphic display is omitted) inputs the calculation result outputted from the NAND circuits 1–m, and calculates the number of stages of the delay cell to delay a portion of one period of the reference clock signal. Further, the calculated number of the delay cell is outputted to the phase control calculation section 4.

Herein, the synchronized signal detecting section 2 has the function as the first input means and detection means.

The reference signal counter section 3 inputs the index signal, and counts the number of input times of the index signal. Then, the counted result is outputted to the phase control calculation section 4. Herein, the reference signal counter section 3 has the function as the counting means.

To the phase control calculation section 4, the number of stages of the delay cells of a portion of one period of the reference clock signal outputted from the synchronized signal detecting section 2, the counted result of the index signal outputted from the reference signal counter section 3, and a command shift amount commanded from the CPU 401 disposed outside the signal controlling circuit 10 as shown in FIG. 1, are inputted.

The phase control calculation section 4 generates the selection signal which selects the output number of stages of the delay chain section 1, and outputs the selection signal to the delay clock signal selection section 5. Specifically, for example, when the delay cells of a portion of one period of the reference clock signal are X stages, command shift amount is Z, predetermined resolving power is 1/n, and count number is K, a shift stage M is calculated as the shift stage M=X stages×1/n×K×Z. Then, a value which adds the shift stages M to the number of stages of the delay cells which outputs the delay signal synchronized with the reference clock signal is outputted as the selection signal.

The resolving power 1/n shows the serration width of the selection signal outputted every when the count number K is added. Specifically, when the resolving power is 1/n, the value of the selection signal changes by making the value in which the number of stages of the delay cell of a portion of one period of the reference clock signal is multiplied by the resolving power 1/n, as the serration width. That is, when the number of stages of the delay cell of the portion of one period of the reference clock signal is 100 stages, and resolving power is 1/50, the select signal is changed by every 100/50 stages, that is, every 2 stages every when the count number K is added. Further, the resolving power 1/n may also be a fixed value which is previously arbitrarily set, or a variable.

A carry C is the data in which 1 is added every when the value of the shift stage M is not lower than the number of stages of the delay cell of a portion of one period of the reference clock signal. The value of the carry C is outputted from the phase control calculation section 4 to the image leading edge signal generation section 6 as the carry signal. Further, the resolving power 1/n and carry C are stored in the storage circuit structured by a RAM provided in the phase control calculation section 4.

Herein, the phase control calculation section 4 has the function as the second input means and phase calculation means. Further, the command shift amount means the phase control signal.

Figure 6:
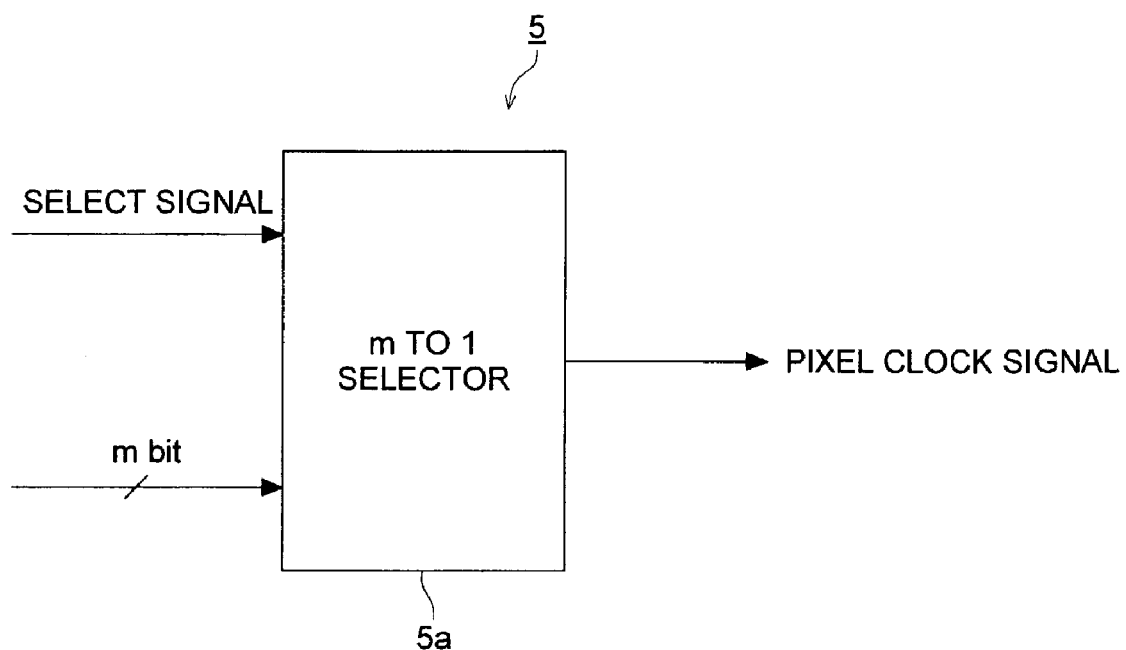
FIG. 6 is a view showing a selector with which a delay clock signal selection section is provided.

A delay clock signal selection section 5 is structured by being provided with a selector 5a as shown in FIG. 6. To this selector 5a, the selection signal outputted from the phase control calculation section 4 and the delay signal DL 1–m outputted from the delay chain section 1 are inputted. Then, the selector 5a selects one signal in the delay signals DL 1–m corresponding to the selection signal, and the selected signal is outputted to the image leading edge signal generation section 6 and to the laser-diode driving section 430 disposed outside the signal controlling circuit 10 as shown in FIG. 1, as the pixel clock signal.

Herein, the delay clock signal selection section 5 has the function as the signal selection means.

The image leading edge signal generation section 6 generates the image leading edge signal synchronized with the pixel clock signal. To the image leading edge signal generation section 6, the carry signal outputted from the phase control calculation section 4 and the pixel clock signal outputted from the delay clock signal selection section 5, and a signal generation control signal commanded from the CPU 401 disposed outside the signal controlling circuit 10 as shown in FIG. 1, are inputted. The signal generation control signal is a signal showing the timing of the generation when the image leading edge signal is generated by being synchronized with the pixel clock signal.

The image leading edge signal generation section 6 determines the timing of the generation of the image leading edge signal according to the signal generation control signal. Further, when the carry signal is not lower than 1, to the position shown by the signal generation control signal, at the timing at which the phase of the value in which the period of the pixel clock signal is multiplied by the value of the carry signal is changed, the image leading edge signal is outputted.

Herein, the image leading edge signal generation section 6 has the function as the signal generation means. Further, the carry signal means the directive signal.

Figure 7:
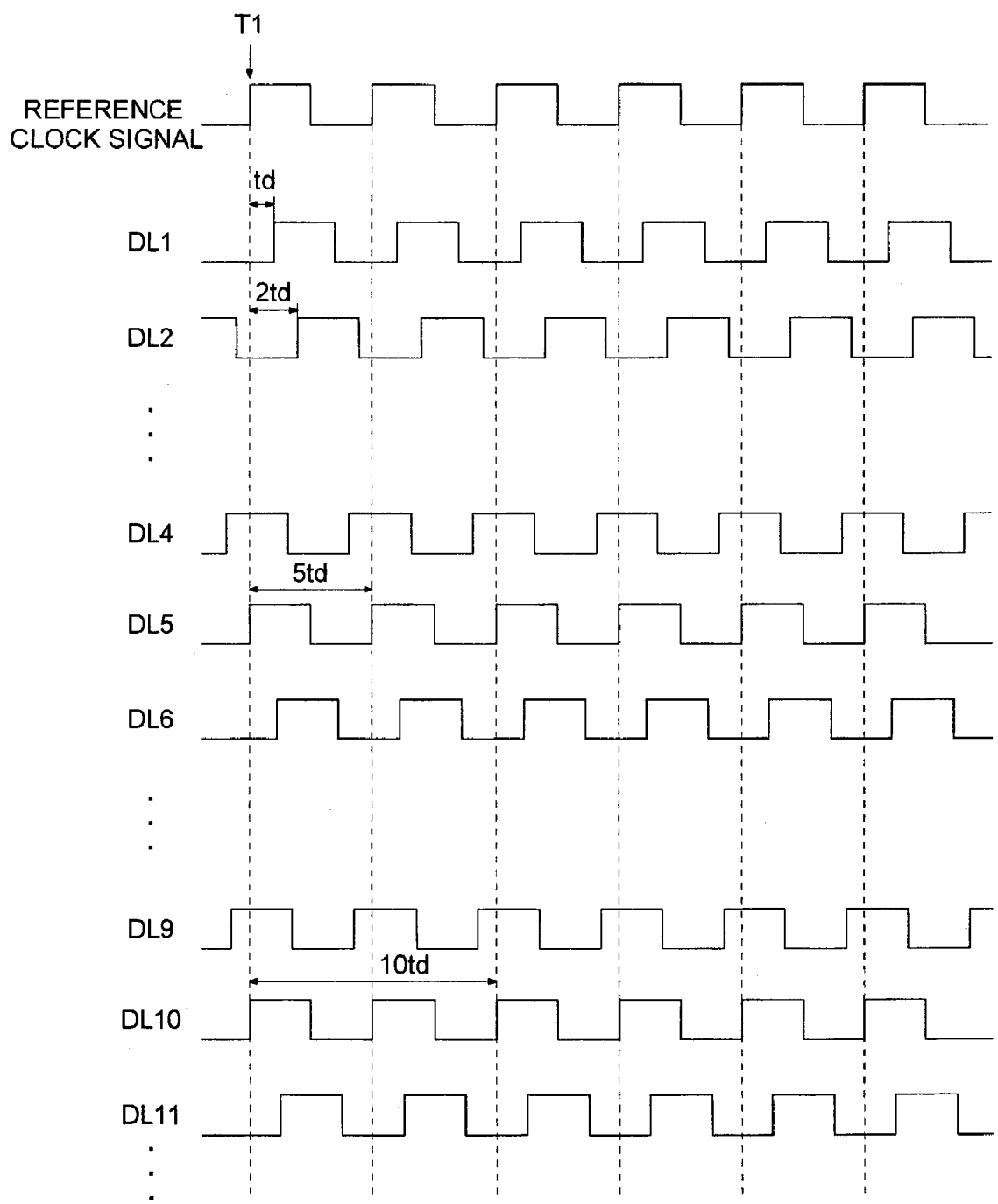
FIG. 7 is a timing chart showing a reference clock signal, and a delay signal outputted from the delay chain section.

Next, referring to FIGS. 7 and 8, the movement in the present embodiment will be described. FIG. 7 is a view showing an example of a timing chart of the reference clock signal inputted to the delay chain section 1 and the delay signals DL 1–11 outputted from the delay chain section 1. As shown in FIG. 7, the delay signal DL 1 delays the reference clock signal by the delay cell DC 1 by a predetermined delay amount (for example, td (ps order)), the delay signal DL 2 delays the reference clock signal by the delay cells DC 1 and 2 by two times of the predetermined amount (that is, 2 td (ps order)), and the delay signal DL 10 delays the reference clock signal by the delay cells DC 1–10 by ten times (that is, 10 td(ps order)) of the predetermined delay amount.

Further, herein, the delay signals DL 5 and 10 are synchronized with the reference clock signal. That is, the time periods 5 td and 10 td which are the delay amounts of the delay signals DL 5 and 10 mean that they are the integer times of the period of the reference clock signal.

Then, the delay chain section 1 outputs the delay signals DL 1–m to the synchronized signal detecting section 2 and delay clock signal selection section 5. The synchronized signal detecting section 2 detects the status of the delay signals DL 1–m at the timing at which the index signal is inputted, and calculates the number of stages of the delay cells corresponding to the portion of one period of the reference clock signal.

For example, as shown in FIG. 7, it is assumed that the index signal is inputted to the synchronized signal detecting section 2 at the timing (time T1 shown in FIG. 7) synchronized with the rising edge of the reference clock signal. At the time T1, the delay signals Dl 1–3, 6, 11 are "L" and delay signals DL 4, 5, 9, 10 are "H". In this manner, D flip-flops FF 1–m maintain the status of the delay signals DL 1–m of the time T1 at which the index signal is inputted, and output it to the NAND circuits N 1–m.

Then, the NAND circuits N 1–m calculate the negative NAND according to the status outputted from D flip-flops FF 1–m, and output the calculation result to the calculation circuit (graphic display is omitted). Then, by the calculation circuit, the signal synchronized with the index signal and not synchronized with it are discriminated. Accordingly, "L" is outputted from the NAND circuits N 5 and 10 corresponding to the delay signals DL 5 and 10 shown in FIG. 5 (that is, the signal synchronized with the index signal), and "H" is outputted from the NAND circuits 5 except the NAND circuits N 5 and 10.

Then, the calculation circuit calculates the number of stages of the delay cell (that is, "10" of the NAND circuits N 10–"5" of the NAND circuits N 5=5 stages) by which the delay of the portion of one period of the reference clock signal is conducted, and outputs it to the phase control calculation section 4.

The reference signal counter section 3 counts the number of times of the inputs of the index signal inputted to one image data, and outputs the counted result to the phase control calculation section 4.

The phase control calculation section 4 inputs the number of stages of the delay cells of the portion of one period of the reference clock signal outputted from the synchronized signal detecting section 2, the number of counts of the index signal outputted from the reference signal counter section 3, and the command shift amount from the outside (for example, a CPU constituting a copier). By calculating by using the inputted values, resolving power 1/n and carry C, the selection signal, by which the output stage number of the delay chain section 1 is selected, is generated, and it is outputted to the delay clock signal selection section 5.

Figure 8:
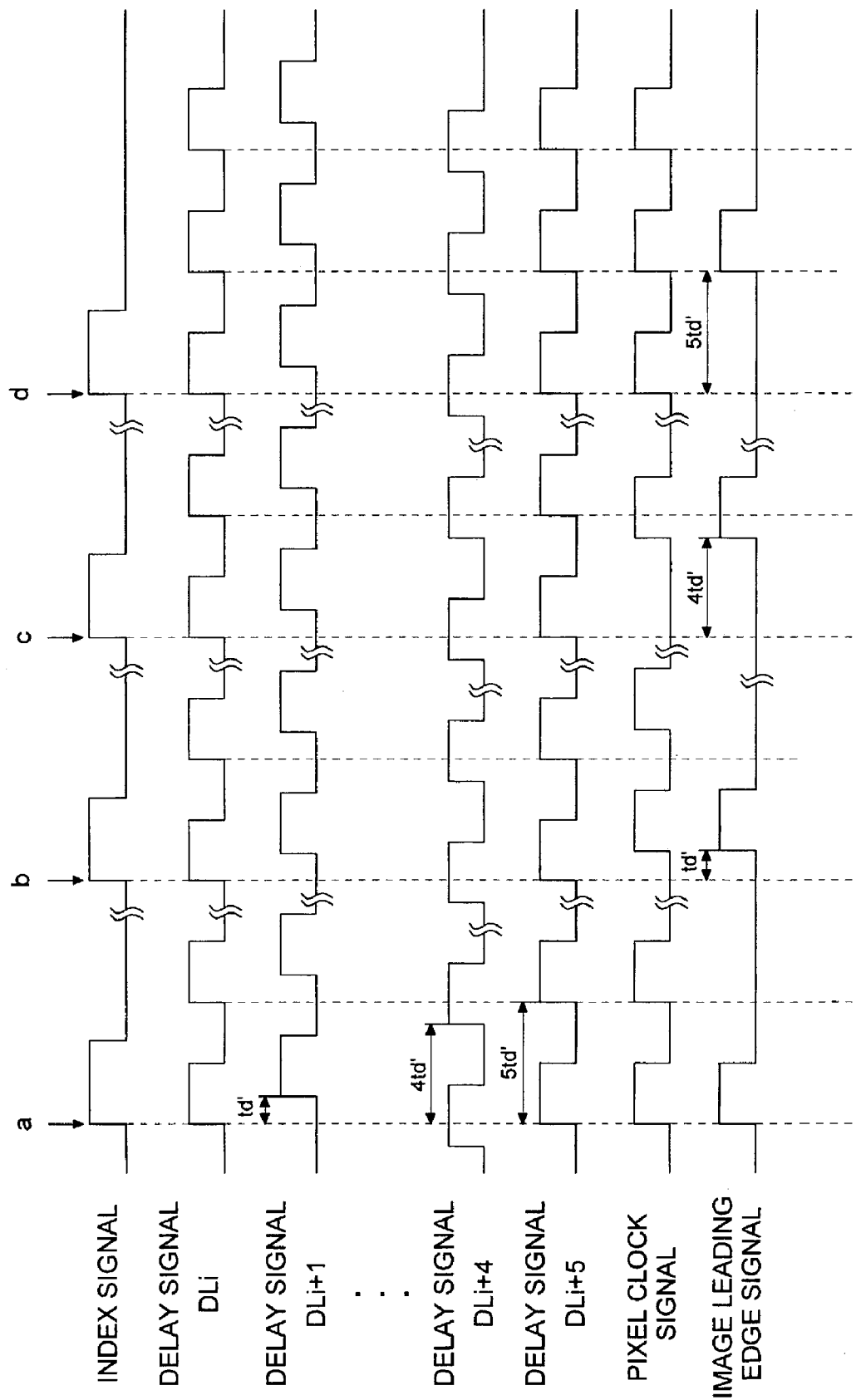
FIG. 8 is a timing chart showing an index signal, delay signal, pixel clock signal, and image leading edge signal.

FIG. 8 is a view showing an example of the timing chart of the index signal inputted from the outside to the signal controlling circuit 10, delay signal inputted to the delay clock signal selection section 5, and pixel clock signal and image leading edge signal outputted from the signal controlling circuit 10.

In FIG. 8, the delay signals DL i, i+1, . . . , i+4, i+5 are a part of the delay signals DL 1–m inputted to the delay clock signal selection section 5, and the pixel clock signal is the signal outputted from the delay clock signal selection section 5. The image leading edge signal is the signal outputted from the image leading edge signal generation section 6.

Herein, for the explanation, a case where the delay amount by the delay cell 1 stage of the delay chain section 1 is td, and the delay cells of the portion of one period of the reference clock signal is 5 stages, is shown as an example. Further, a case where the resolving power is 1/5, and command shift amount Z=i, and an initial value of the number of count K and carry C is zero, will be described below.

In FIG. 8, when the first time index signal is inputted at the timing a, the delay clock signal selection section 5 selects the delay signal DL i by the selection signal, and outputs the signal as the pixel clock signal. Then, the image leading edge signal generation section 6 outputs the image leading edge signal in timed relationship with the pixel clock signal.

Successively, when the second time index signal is inputted at the timing b, the delay clock signal selection section 5 selects the delay signal DL i+1, by the selection signal, and outputs the signal as the pixel clock signal. Then, the image leading edge signal generation section 6 outputs the image leading edge signal in timed relationship with the pixel clock signal. At this time, the image leading edge signal is outputted by being delayed by about the time td' to the rising edge of the index signal.

Next, when 5th time index signal is inputted at the timing c, the delay clock signal selection section 5 selects the delay signal DL i+4 by the selection signal, and outputs the signal as the pixel clock signal. Then, the image leading edge signal generation section 6 generates the image leading edge signal in timed relationship with the pixel clock signal. At this time, the image leading edge signal is outputted by being delayed by about the time 4 td' to the rising edge of the index signal.

Successively, when 6th time index signal is inputted at the timing d, because the shift stage M calculated in the phase control calculation section 4 exceeds the number of stages (in FIG. 6, "5") of the delay cell of the portion of one period of the reference clock signal, the carry C is made "1" and the shift stage M is calculated, and the selection signal is outputted. Accordingly, the delay clock signal selection section 5 selects the delay signal DL i by the selection signal, and outputs the signal as the pixel clock signal. Then, the image leading edge signal generation section 6 generates the image leading edge signal at the timing which is delayed by one period to the pixel clock signal. At this time, the image leading edge signal is outputted by being delayed by about the time 5 td' to the rising edge of the index signal.

In this connection, when the timing in timed relationship with the pixel clock signal by which the image leading edge signal generation section 6 outputs the image leading edge signal, can be arbitrarily set by the signal generation control signal inputted from the CPU 401 disposed outside the signal controlling circuit 10 as shown in FIG. 1. Further, every when the index signal is inputted from the outside, the pixel clock signal switched by the delay clock signal select section 5 is outputted, however, in order to use the stable pixel clock signal, the image leading edge signal generation section 6 outputs the delay clock signal, and it is generated in timed relationship with the pixel clock signal after the passage of the predetermined periods.

In this manner, the signal controlling circuit 10 outputs the signal, the phase of which is shifted from that of the reference clock signal and which serves as the pixel clock signal, to the laser-diode driving section 430. Further, the signal controlling circuit 10 also outputs the image leading edge signal, the phase of which is synchronized with that of the pixel clock signal, to both the image-processing section 420 and the laser-diode driving section 430 shown in FIG. 1, so as to make it possible to control the writing start position of the front of each line of the image.

Figure 9:
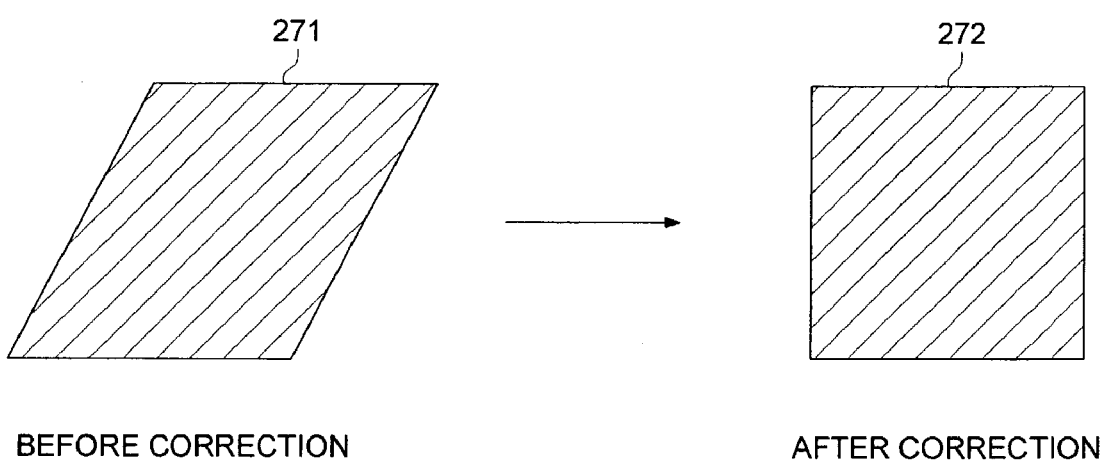
FIG. 9 is a view showing an image before and after the correction by the signal controlling circuit 10.

That is, as shown in FIG. 9, the image 271 slantingly outputted before the correction by the image forming apparatus such as a copier can be straightly outputted by correcting the inclination as the image 272 when the image leading edge signal showing the writing-start position of the front of each line of the image is controlled by using the signal controlling circuit 10.

Furthermore, by the signal generation control signal inputted into the image leading edge signal generation section 6, because the timing at which the image leading edge signal is outputted can be arbitrarily set, the writing-start position of the front of each line can also be arbitrarily controlled. That is, the shift amount of the writing-start position of the front of each line of the image can be arbitrarily set.

As described above, according to the signal controlling circuit 10 of the present embodiment, m bits of the delay signal which is delayed by a predetermined delay amount from the reference clock signal in the delay chain section 1, is outputted, and number of the delay cell necessary for conducting the delay of the portion of one period of the reference clock signal in the synchronized signal detecting section 2 is detected. Then, the phase control calculation section 4 calculates the shift stage M according to the number of stages of the delay cells calculated by the synchronized signal detecting section 2, count number of the index signal inputted from the reference signal count section 3, command shift stage Z inputted from the outside (for example, CPU constituting the copier), and resolving power 1/n. Further, according to the shift stage M, the selection signal is generated, and the selection signal is outputted to the delay clock signal selection section 5.

The delay clock signal selection section 5 selects one signal in the delay signals outputted by the delay chain section 1, and outputs the selected signal to the outside as the pixel clock signal, and outputs it to the image leading edge signal generation section 6.

The image leading edge signal generation section 6 generates the signal synchronized with the inputted pixel clock signal corresponding to the signal generation control signal inputted from the outside (for example, CPU 401 shown in FIG. 1), and outputs it as the image leading edge signal to the outside (in the embodiment shown in FIG. 1, the image-processing section 420 and the laser-diode driving section 430).

Accordingly, the signal generation circuit 10 generates the delay signal whose time period of 1 period/n of the reference clock signal is delayed, and to the index signal inputted from the outside, outputs the delay signal in which the arbitrary shift amount is delayed as the pixel clock signal. Thereby, because the timing of the pixel clock signal can be high accurately controlled, the inclination of the image (distortion) can also be high accurately corrected.

Furthermore, the image leading edge signal is generated at the timing synchronized with the pixel clock signal, however, it can control the timing generating the image leading edge signal by the signal generation control signal inputted from the outside (for example, CPU 401 included in the image-forming apparatus shown in FIG. 1). Therefore, when the signal generation control signal is arbitrarily set, the writing-start position of the front of each line of the image can be arbitrarily controlled.

The values of the resolving power 1/n and the signal generation control signal are previously set according to the change of the lens characteristic of the writing unit and reading unit due to the temperature change of the image forming apparatus such as the copier, production error at the time of the assembly of the apparatus, or production fluctuation of each product, and stored in the storage circuit including in the image forming apparatus, and delivered. Then, when the image is formed by the copier, the writing-start position of the front of each line of the image is controlled, thereby, the inclination (distortion) of the image is corrected and outputted.

Further, when the signal controlling circuit 10 is structured in the integrated circuit (digital circuit), the signal controlling circuit 10 can realize the high accurate delay, and the signal controlling circuit 10 can be provided at low cost.

In this connection, the present invention is not limited to the content of the above embodiment, but can be appropriately changed within the scope not departing from the spirit of the present invention, and for example, in order to realize more complicated correction of the image, as the calculation expression of the shift stage M in the phase control calculation section 4, "the shift stage M=X stages×1/n×K×Z" is described as one example, however, it is not limited to this, but it may be also the calculation expression including the second degree function. Thereby, more complicated correction can be conducted on the image. Further, the resolving power 1/n may also be a value inputted from the outside (for example, CPU constituting the copier). Thereby, when the resolving power 1/n is set to the small value, the image can more finely corrected. Further, in the present embodiment, it is described that the shift stage M is added every 1 index signal, but the shift stage M may also be added every plurality of index signals. Further, the value of the shift stage M may also be different depending on the index signal, and the shift stage M can be arbitrarily set at every input of the index signal in the phase control calculation section 6.

According to the present invention described in the foregoing, the following effects can be attained.

(1) For example, according to the delay reference clock signal synchronized with a predetermined signal such as a pulse signal or step signal, the number of stages of the delay elements according to one period of the reference clock signal is detected, and the phase amount is calculated according to this number of stages, counting amount, and phase control signal. Then, based on this phase amount, the signal, which is alternatively selected from the delay reference clock signal, is outputted to an external section. Thereby, the timing of the delay reference clock signal can be controlled in the time period not larger than one period of the reference clock signal, and the high accuracy control can be realized.

(2) Further, by arbitrarily setting a phase control signal, the delay reference clock signal whose phase is so much changed as an arbitrary phase amount to the reference clock signal can be selected and outputted.

(3) A signal synchronized with the signal outputted from the signal selection means is generated at a timing based on the signal generation control signal. For example, when this signal is a signal for setting the writing-start position of the leading edge of each line of the image, the writing-start position of the leading edge of each line of the image can be high accuracely controlled.

(4) Further, by arbitrarily setting the signal generation control signal, the writing-start position of the leading edge of each line of the image can be arbitrarily controlled.

(5) The signal generation means generates the signal synchronized with the signal outputted from the signal selection means according to the directive signal and the signal generation control signal. For example, when this signal is a signal for setting the writing-start position of the head of each line of the image, the inclination of the image can be corrected and outputted. Disclose embodiment can be varied by a skilled person without departing from the spirit and scope of the invention.

What is claimed is:

1. A circuit for controlling signals to form an image, said circuit comprising:
    a delay chain section, including a plurality of delay stages cascaded for delaying a reference clock signal step by step, to generate a plurality of delayed clock signals which are outputted from plurality of delay stages, respectively;
    a synchronized signal detecting section to detect a number of delay stages, a total delay time of which is equivalent to a single period of said reference clock signal, based on delayed clock signals which are synchronized with an index signal inputted into the synchronized signal detection section and selected from said plurality of delayed clock signals, said index signal serving as a leading edge reference signal of each scanning line of said image;
    an index signal counting section to count index signals inputted thereto so as to output a count number of said index signals;
    a phase shift calculating section to calculate a phase shift amount with respect to said reference clock signal, based on said number of delay stages detected by said synchronized-signal detecting section, said count number counted by said index signal counting section, and a phase shift controlling signal inputted into said phase shift calculating section;
    a delayed clock selecting section to select a specific delayed clock signal out of said plurality of delayed clock signals in an alternative way, based on said phase shift amount calculated by said phase shift calculating section, so as to output said specific delayed clock signal as a pixel clock signal; and
    a signal generating section to generate an image leading edge signal that is synchronized with the pixel clock signal outputted from the delayed clock selecting section.

2. The circuit of claim 1, wherein the image leading edge signal is generated based on a signal generating command signal inputted into said signal generating section.

3. The circuit of claim 2, wherein said phase shift calculating section outputs a carry signal when said phase shift amount exceeds said single period of said reference clock signal, and
    wherein said signal generating section generates said image leading edge signal based on said carry signal and said signal generating command signal.

4. An apparatus for forming an image, said apparatus comprising:
    an image-processing section to process image data that represents said image;
    an image-writing element driving section to drive an image-writing element based on processed image data outputted from said image-processing section;
    an index sensor to detect an index signal serving as a leading edge reference signal for each scanning line of said image;
    a reference clock generator to generate a reference clock signal;
    a signal controlling circuit to control said index signal and said reference clock signal, so as to output a pixel clock signal which is inputted into said image-writing element driving section; and
    a control section to control at least said image-processing section, said image-writing element driving section and said signal controlling circuit;
    wherein said signal controlling circuit comprises:
        a delay chain section, including a plurality of delay stages cascaded for delaying said reference clock signal step by step, to generate a plurality of delayed clock signals which are outputted from said plurality of delay stages, respectively;
        a synchronized signal detecting section to detect a number of delay stages, a total delay time of which is equivalent to a single period of said reference clock signal, based on delayed clock signals which are synchronized with said index signal and selected from said plurality of delayed clock signals, said index signal being inputted into said synchronized-signal detecting section from said index sensor;
        an index signal counting section to count index signals inputted thereto so as to output a count number of said index signals;
        a phase shift calculating section to calculate a phase shift amount with respect to said reference clock signal, based on said number of delay stages detected by said synchronized-signal detecting section, said count number counted by said index signal counting section, and a phase shift controlling signal inputted into said phase shift calculating section from said control section;

a delayed clock selecting section to select a specific delayed clock signal out of said plurality of delayed clock signals in an alternative way, based on said phase shift amount calculated by said phase shift calculating section, so as to output said specific delayed clock signal as said pixel clock signal to said image-writing element driving section; and a signal generating section to generate an image leading edge signal that is synchronized with the pixel clock signal outputted from the delayed clock selecting section.

5. The apparatus of claim 4, wherein:

the image leading edge signal is generated based on a signal generating command signal inputted into said signal generating section from said control section; and said signal controlling circuit outputs said leading edge positioning signal to both said image-processing section and said image-writing element driving section.

6. The apparatus of claim 5, wherein said phase shift calculating section outputs a carry signal when said phase shift amount exceeds said single period of said reference clock signal, and wherein said signal generating section generates said image leading edge signal based on said carry signal and said signal generating command signal.

7. The apparatus of claim 4, wherein said image-writing element comprises a laser diode, and said image-writing element driving section comprises a laser-diode driving section.

8. A signal controlling circuit, comprising:

a delay chain sections, including a plurality of delay stages cascaded for delaying a reference clock signal step by step, to generate a plurality of delayed clock signals which are outputted from said plurality of delay stages, respectively;

a detecting section to detect a number of delay stages, a total delay time of which is equivalent to a single period of said reference clock signal, based on a delayed clock signal which is synchronized with a predetermined signal and selected from said plurality of delayed clock signals;

a counting section to count predetermined signals corresponding to said predetermined signal, so as to output a count number of the predetermined signals;

a phase shift calculating section to calculate a phase shift amount with respect to said reference clock signal, based on said number of delay stages detected by said detecting section, said count number counted by said counting section, and a phase shift controlling signal;

a selecting section to select a specific delayed clock signal out of said plurality of delayed clock signals in an alternative way, based on said phase shift amount calculated by said phase shift calculating section, so as to output said specific delayed clock signal as a pixel clock signal; and a signal generating section to generate a signal that is synchronized with the pixel clock signal outputted from the selecting section.

9. The signal controlling circuit of claim 8, wherein the signal that is synchronized with the pixel clock signal is generated based on a signal generating command signal.

10. The signal controlling circuit of claim 9, wherein said phase shift calculating section outputs a carry signal when said shift amount exceeds said single period of said reference clock signal, and wherein said signal generating section generates said signal based on said carry signal and said signal generating command signal.

* * * * *